(12) United States Patent
Kim et al.

(10) Patent No.: US 9,142,795 B2
(45) Date of Patent: Sep. 22, 2015

(54) ORGANIC LIGHT-EMITTING DIODE

(71) Applicant: SAMSUNG DISPLAY CO., LTD., Yongin, Gyeonggi-Do (KR)

(72) Inventors: Na-Jeong Kim, Yongin (KR); Seung-Wook Chang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/023,430

(22) Filed: Sep. 10, 2013

(65) Prior Publication Data

US 2014/0353596 A1 Dec. 4, 2014

(30) Foreign Application Priority Data

May 29, 2013 (KR) ........................ 10-2013-0061250

(51) Int. Cl.
| | | |
|---|---|---|
| *H01L 51/52* | (2006.01) | |
| *H01L 51/50* | (2006.01) | |
| *H01L 51/00* | (2006.01) | |
| *H01L 27/32* | (2006.01) | |

(52) U.S. Cl.
CPC ........ *H01L 51/5215* (2013.01); *H01L 51/5064* (2013.01); *H01L 27/3211* (2013.01); *H01L 51/0058* (2013.01); *H01L 51/0067* (2013.01); *H01L 51/0072* (2013.01); *H01L 51/0077* (2013.01); *H01L 51/0081* (2013.01); *H01L 51/0085* (2013.01); *H01L 2251/308* (2013.01)

(58) Field of Classification Search
CPC ............ H01L 51/0072; H01L 51/0097; H01L 51/5215; H01L 51/5004; H01L 51/5064; H01L 51/5084
USPC .......................................................... 257/40
See application file for complete search history.

(56) References Cited

U.S. PATENT DOCUMENTS 6,384,529 B2   5/2002   Tang et al.
7,292,294 B2  11/2007   Hung et al.
(Continued)

FOREIGN PATENT DOCUMENTS

KR   10-2006-0036328 A   4/2006
KR      10-0669772 B1    1/2007
(Continued)

OTHER PUBLICATIONS

Korean Patent Abstract, Publication No. 10-2006-0055098 A, dated May 23, 2006 for corresponding Korean Patent 10-0669772.
(Continued)

*Primary Examiner* — Matthew W Such
*Assistant Examiner* — Warren H Kilpatrick
(74) *Attorney, Agent, or Firm* — Christie, Parker & Hale, LLP

(57) ABSTRACT

An organic light-emitting diode includes a first electrode and a second electrode facing the first electrode; an emission layer between the first electrode and the second electrode; a hole transport layer between the first electrode and the emission layer and includes a first hole transport layer, a second hole transport layer, and a buffer layer between the first hole transport layer and the second hole transport layer; and an electron transport layer between the emission layer and the second electrode, wherein the buffer layer and the electron transport layer each include a mixture of an electron-transporting organometallic compound and an electron-transporting organic compound.

20 Claims, 4 Drawing Sheets

(56) References Cited

U.S. PATENT DOCUMENTS

| | | |
|---|---|---|
| 7,309,955 B2 | 12/2007 | Kim |
| 7,402,946 B2 | 7/2008 | Park et al. |
| 7,547,462 B2 | 6/2009 | Kim et al. |
| 7,679,093 B2 | 3/2010 | Park et al. |
| 2007/0164275 A1 | 7/2007 | Ishiguro |
| 2007/0200492 A1 | 8/2007 | Cok et al. |
| 2007/0257943 A1 | 11/2007 | Miller et al. |
| 2009/0102352 A1 | 4/2009 | Cok et al. |
| 2009/0135104 A1 | 5/2009 | Jeong |
| 2009/0191428 A1* | 7/2009 | Hatwar et al. ............... 428/690 |
| 2009/0200544 A1 | 8/2009 | Lee et al. |
| 2009/0200922 A1 | 8/2009 | Lee et al. |
| 2009/0212691 A1* | 8/2009 | Yang ........................... 313/504 |
| 2010/0124796 A1 | 5/2010 | Yamazaki et al. |
| 2010/0187521 A1 | 7/2010 | Park et al. |
| 2012/0097989 A1 | 4/2012 | Lee et al. |
| 2012/0243219 A1* | 9/2012 | Ohsawa et al. ............... 362/230 |
| 2014/0225082 A1* | 8/2014 | Park et al. ........................ 257/40 |

FOREIGN PATENT DOCUMENTS

| | | |
|---|---|---|
| KR | 10-0700491 B1 | 3/2007 |
| KR | 10-0712096 B1 | 4/2007 |
| KR | 10-2010-0086672 A | 8/2010 |
| KR | 10-2011-0043324 A | 4/2011 |
| KR | 10-2012-0042038 A | 5/2012 |

OTHER PUBLICATIONS

Korean Patent Abstract, Publication No. 10-2006-0112965 A, dated Nov. 2, 2006 for corresponding Korean Patent 10-0700491.

Korean Patent Abstract, Publication No. 10-2005-0082644 A, dated Aug. 24, 2005 for corresponding Korean Patent 10-0712096.

* cited by examiner

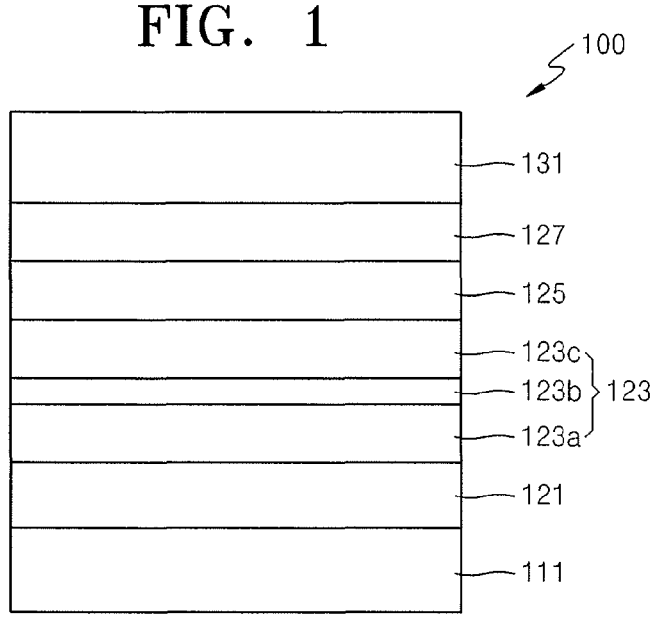
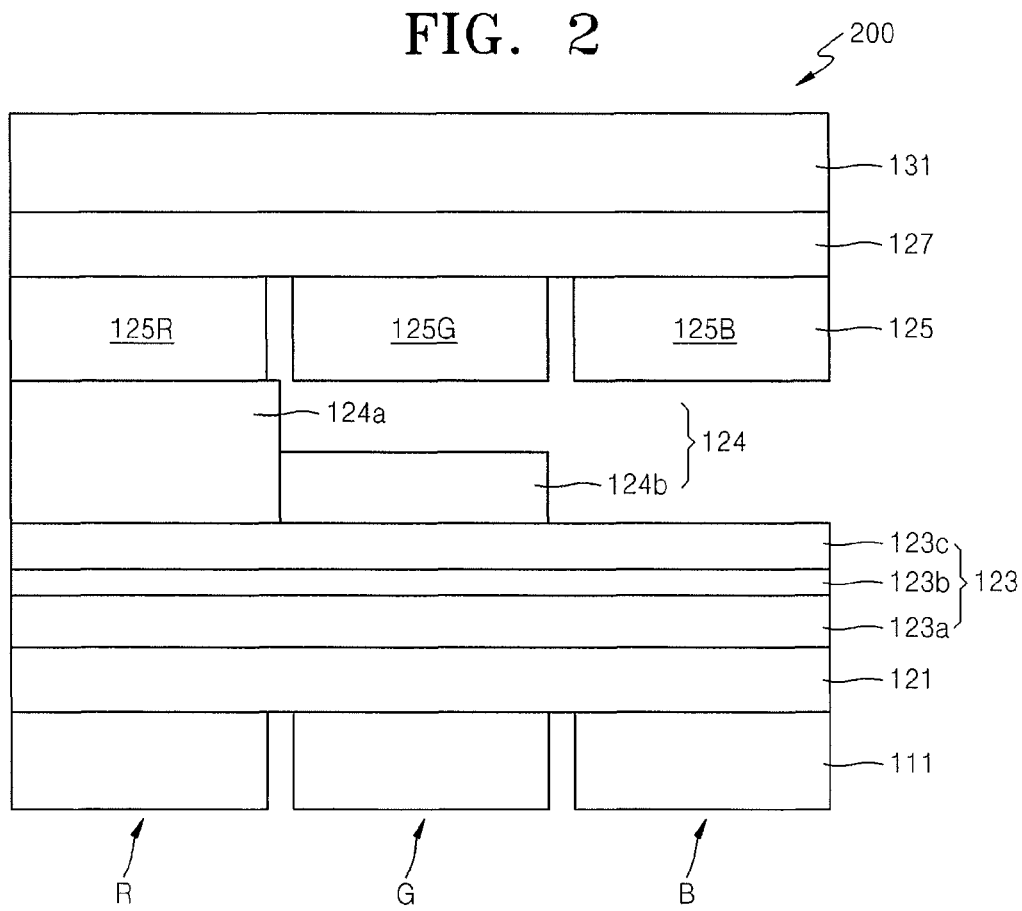

ORGANIC LIGHT-EMITTING DIODE

CROSS-REFERENCE TO RELATED APPLICATION

This application claims priority to and the benefit of Korean Patent Application No. 10-2013-0061250, filed on May 29, 2013, in the Korean Intellectual Property Office, the disclosure of which is incorporated herein in its entirety by reference.

BACKGROUND

1. Field

The present disclosure relates to an organic light-emitting diode.

2. Description of the Related Art

Organic light-emitting diodes (OLEDs) use light-emitting materials that emit light themselves when a voltage is applied thereto. OLEDs have advantages, such as high brightness, excellent contrast, wide viewing angles, quick responses, or low driving voltages, and may provide multi-color images.

A typical OLED has a structure including an organic emission layer (EML) that is interposed between an anode and a cathode. When a voltage is applied to the OLED, holes from the anode and electrons from the cathode are injected into the organic EML. The injected holes and electrons cause electron exchange among adjacent molecules within the organic EML, and then move to electrodes of opposite polarities. When the holes and electrons recombine in molecules, excitons having a high-energy excited state are generated. As the excitons return to a low-energy ground state, the materials emit lights. To improve brightness and efficiency, the OLED may further include an electron injection layer (EIL), an electron transport layer (ETL), a hole transport layer (HTL), a hole injection layer (HIL), and/or the like, in addition to an EML.

An OLED may have sub-pixels emitting different colors that are homogeneously arranged to represent a full (for example, white) color by using the microcavity effect. There have been efforts taken to reduce the differences in the lifetime and characteristics according to colors.

SUMMARY

Aspects of embodiments of the present invention relate to an organic light-emitting diode (OLED) having high efficiency and improved lifetime.

According to an embodiment of the present invention, an organic light-emitting diode (OLED) includes:

a first electrode and a second electrode facing the first electrode;

an emission layer between the first electrode and the second electrode;

a hole transport layer between the first electrode and the emission layer and including a first hole transport layer, a second hole transport layer, and a buffer layer between the first hole transport layer and the second hole transport layer; and an electron transport layer between the emission layer and the second electrode, wherein each of the buffer layer and the electron transport layer includes a mixture of an electron-transporting organometallic compound and an electron-transporting organic compound.

In the OLED, the electron-transporting organometallic compound may include lithium quinolate (LiQ), bis(2-methyl-8-quinolinolate)-4-(phenylphenolato)aluminium (BAlq), tris(8-hydroxy-quinolinato)aluminium ($Alq_3$), or beryllium bis(benzoquinolin-10-olate) ($Bebq_2$).

In the OLED, the electron-transporting organic compound may include 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), 9,10-di(naphthalene-2-yl)anthracene (ADN), or compounds represented by Formulas 201 and 202.

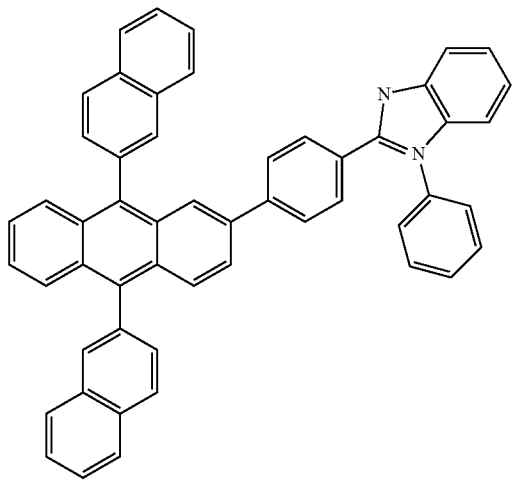

201

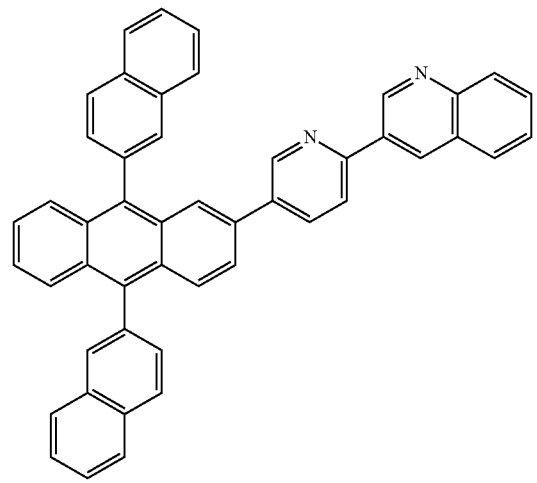

202

The OLED may have a sum of thicknesses of the first hole transport layer and the second hole transport layer in a range from about 400 Å to about 2,500 Å.

The OLED may have a thickness of the buffer layer in a range from about 5 Å to about 20 Å.

In the OLED, the electron-transporting organometallic compound and the electron-transporting organic compound may be mixed in the buffer layer at a weight ratio in a range from 1:3 to 1:7.

In the OLED, the electron-transporting organometallic compound and the electron-transporting organic compound may be mixed in the electron transport layer at a weight ratio in a range from 2:1 to 5:1.

According to another embodiment of the present invention, an organic light-emitting diode (OLED) includes a first pixel region; a second pixel region; a third pixel region;

an anode having regions separated to correspond to the first, second, and third pixel regions;

a first hole transport layer on the regions of the anode;

a buffer layer on the first hole transport layer;

a second hole transport layer on the buffer layer;

an emission layer on the second hole transport layer and including a first emission layer of the first pixel region, a second emission layer of the second pixel region, and a third emission layer of the third pixel region;

an electron transport layer on the emission layer; and a cathode on the electron transport layer, wherein each of the buffer layer and the electron transport layer includes a mixture of an electron-transporting organometallic compound and an electron-transporting organic compound.

In the OLED, the electron-transporting organometallic compound may include lithium quinolate (LiQ), bis(2-methyl-8-quinolinolate)-4-(phenylphenolato)aluminium (BAlq), tris(8-hydroxy-quinolinato)aluminium ($Alq_3$), or beryllium bis(benzoquinolin-10-olate) ($Bebq_2$).

In the OLED, the electron-transporting organic compound may include 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), 9,10-di(naphthalene-2-yl)(anthracene) (ADN), or compounds represented by Formulas 201 and 202.

In the OLED, the first pixel region displays red, the second pixel region displays green, and the third pixel region displays blue.

BRIEF DESCRIPTION OF THE DRAWINGS

The above and other features and enhancements of the present invention will become more apparent by describing in more detail example embodiments thereof with reference to the attached drawings in which:

FIG. 1 is a schematic cross-sectional view illustrating a structure of an organic light-emitting diode (OLED) according to an embodiment of the present invention;

FIG. 2 is a schematic cross-sectional view illustrating a structure of an OLED according to another embodiment of the present invention;

DETAILED DESCRIPTION

Figure 3:
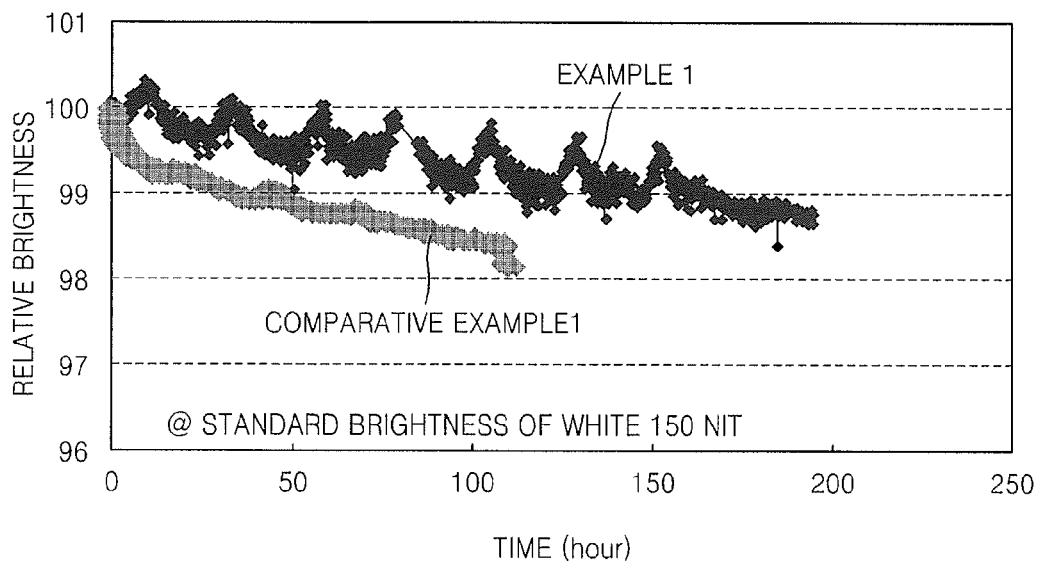
FIG. 3 is a graph showing a comparison of relative brightness of each OLED of Example 1 and Comparative Example 1 over time.

The invention will now be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, for clarity of description, the thickness of some layers and regions is shown exaggerated. Like numbers refer to like elements throughout the specification.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a schematic cross-sectional view illustrating a structure of an organic light-emitting diode (OLED) 100 according to an embodiment of the present invention.

The OLED 100 includes an anode 111, a hole injection layer (HIL) 121, a hole transport layer (HTL) 123, an emission layer (EML) 125, an electron transport layer (ETL) 127, and a cathode 131. The HTL 123 includes a first HTL 123a, a second HTL 123c, and a buffer layer 123b interposed therebetween.

The anode 111 may include materials having a relatively high work function. The anode 111 may be formed of, for example, a transparent conductive oxide, such as indium tin oxide (ITO), indium zinc oxide (IZO), zinc oxide (ZnO), Al-doped zinc oxide (AZO), indium oxide ($In_2O_3$), or tin dioxide ($SnO_2$), but examples of the materials are not limited thereto. The anode 111 may be formed by vacuum deposition or sputtering.

The HIL 121 is formed on top of the anode 111. Examples of suitable materials of the HIL 121 include a phthalocyanine compound such as copper phthalocyanine; N,N'-diphenyl-N,N'-bis-[4-(phenyl-m-tolyl-amino)-phenyl]-biphenyl-4,4'-diamine (DNTPD); 4,4',4''-tris(3-methylphenylphenylamino)triphenylamine (m-MTDATA); 4,4'4''-tris(N,N-diphenylamino)triphenylamine (TDATA); 4,4',4''-tris{N-(2-naphthyl)-N-phenylamino}-triphenylamine (2T-NATA); poly(3,4-ethylenedioxythiophene)/poly(4-styrenesulfonate) (PEDOT/PSS); polyaniline/dodecylbenzenesulfonic acid (PANI/DBSA); polyaniline/camphor sulfonic acid (PANI/CSA) or polyaniline/poly(4-styrenesulfonate) (PANI/PSS); and LG101, but are not limited thereto.

The HIL 121 may be formed by using various methods, such as vacuum deposition, spin coating, casting, and Langmuir-Blodgett (LB) deposition. The HIL 121 may be formed of a single layer or a multi-layer that includes two or more layers having different materials.

When the HIL 121 is formed by vacuum deposition, vacuum deposition conditions may vary depending on a compound that is used to form the HIL 121 and characteristics of the target HIL 121. However, the conditions may be appropriately selected by, for example, a temperature in a range of about 100° C. to about 500° C., a pressure in a range of about $10^{-8}$ torr to about $10^{-3}$ torr, and a deposition rate in a range of about 0.01 Å/sec to about 100 Å/sec.

When the HIL 121 is formed by spin coating, the coating conditions may vary depending on a compound that is used to form the HIL 121 and characteristics of the target HIL 121. However, the coating conditions may be appropriately selected by, for example, a coating rate in a range of about 2,000 rpm to about 5,000 rpm and a temperature for removal of a solvent after coating in a range of about 80° C. to about 200° C.

A thickness of the HIL 121 may be in a range of about 100 Å to about 10,000 Å, for example, about 100 Å to about 1,000 Å. In one embodiment, when the thickness of the HIL 121 is within the above ranges, the HIL 121 has satisfactory hole injection characteristics without a substantial decrease in a driving voltage.

The first HTL 123a is formed on top of the HIL 121. Examples of suitable materials of the first HTL 123a include a carbazole derivative, such as N-phenylcarbazole and polyvinylcarbazole; N,N'-bis(3-methylphenyl)-N,N'-diphenyl-[1,1-biphenyl]-4,4'-diamine (TPD); N,N'-di(1-naphthyl)-N,N'-diphenylbenzidine (NPB); and a triphenylamine-based material, such as 4,4',4"-tris(N-carbazolyl)triphenylamine (TCTA), but are not limited thereto.

The first HTL 123a may be formed by using various suitable methods, such as vacuum deposition, spin coating, casting, and LB deposition. When the first HTL 123a is formed by vacuum deposition and spin coating, the deposition and coating conditions may be similar to those for the formation of the HIL 121, although the deposition and coating conditions may vary depending on a material that is used to form the first HTL 123a.

A thickness of the first HTL 123a may be in a range of about 300 Å to about 1,000 Å.

The buffer layer 123b is formed on top of the first HTL 123a. The buffer layer 123b may include a mixture of an electron-transporting organometallic compound and an electron-transporting organic compound. Examples of suitable electron-transporting organometallic compound in the buffer layer 123b include lithium quinolate (LiQ), bis(2-methyl-8-quinolinolate)-4-(phenylphenolato)aluminium (BAIq), tris(8-hydroxy-quinolinato)aluminium (Alq$_3$), and beryllium bis(benzoquinolin-10-olate) (Bebq$_2$), but are not limited thereto. Examples of suitable electron-transporting organic compound in the buffer layer 123b include 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), 9,10-di(naphthalene-2-yl)anthracene (ADN), and compounds represented by Formulas 201 and 202, but are not limited thereto:

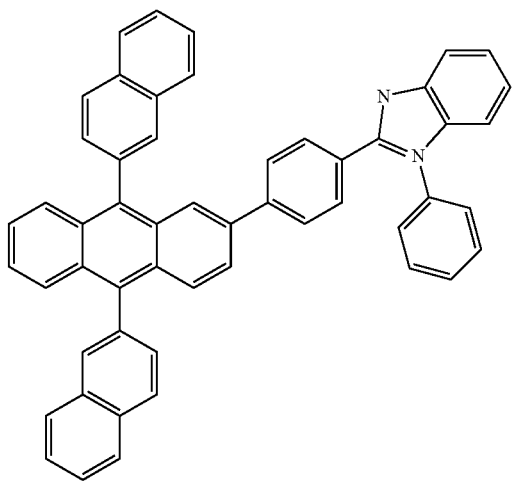

201

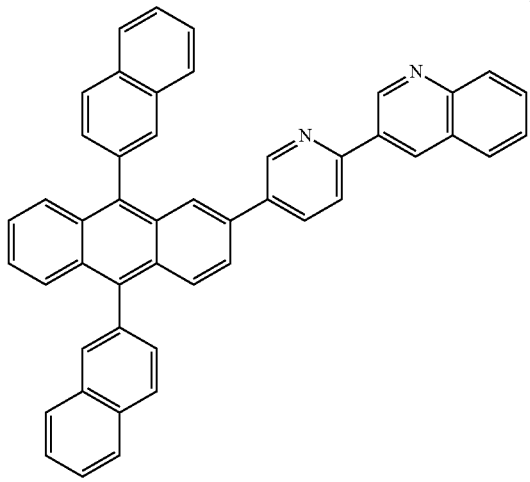

202

In the buffer layer 123b, a weight ratio of the electron-transporting organometallic compound and the electron-transporting organic compound may be in a range of 1:3 to 1:7. In one embodiment, when the weight ratio is within the above ranges, a transport rate of holes is appropriately reduced for charge balance of electrons in the EML.

A thickness of the buffer layer 123b may be in a range of about 5 Å to about 20 Å. In one embodiment, when the thickness of the buffer layer 123b is within the above ranges, the buffer layer 123b has a satisfactory transport rate of holes without a substantial decrease in a driving voltage.

The buffer layer 123b may be formed in a way that the electron-transporting organometallic compound and the electron-transporting organic compound are co-deposited. However, a method of forming the buffer layer 123b is not limited thereto.

The second HTL 123c is formed on top of the buffer layer 123b. Examples of suitable materials of the second HTL 123c include a carbazole derivative, such as N-phenylcarbazole and polyvinylcarbazole; TPD; NPB; and a triphenylamine-based material, such as TCTA, but are not limited thereto. The second HTL 123c may be formed of the same material as the first HTL 123a.

A thickness of the second HTL 123c may be in a range of about 100 Å to about 1,500 Å. A thickness of suitable the HTL 123 including the first HTL 123a, the buffer layer 123b, and the second HTL 123c may be in a range of about 400 Å to about 2,500 Å. In one embodiment, when the thickness of the HTL 123 is within the above ranges, the HTL 123 has satisfactory hole transport characteristics without a substantial increase in a driving voltage.

In some embodiments, at least one layer of the HIL 121, the first HTL 123a, and the second HTL 123c may further include a charge-generating material to improve conductivity of a film, in addition to the materials for forming the HIL 121 and the HTL 123 as described above.

The charge-generating material may be, for example, a p-dopant. Non-limiting examples of suitable p-dopant include a quinone derivative, such as tetracyanoquinodimethane (TCNQ) or 2,3,5,6-tetrafluoro-tetracyano-1,4-benzoquinodimethane (F4TCNQ); and a metal oxide such as a tungsten oxide or a molybdenym oxide, but are not limited thereto.

When the HIL 121 or the HTL 123 further includes the charge-generating material, the charge-generating material may be homogeneously dispersed or non-homogeneously distributed in these layers.

The EML 125 is formed on top of the HTL 123 by using various methods, such as vacuum deposition, spin coating, casting, or LB deposition. When the EML 125 is formed by vacuum deposition and spin coating, the deposition and coating conditions may be similar to those for the formation of HIL 121, although the deposition and coating conditions may vary depending on a compound that is used to form the EML 125.

As a material for forming the EML 125, at least one of a suitable emitting-materials (including both a host and a dopant) may be used.

Examples of a suitable host include $Alq_3$, 4,4'-bis(N-carbazolyl)-1,1'-biphenyl (CBP), poly(n-vinylcabazole) (PVK), ADN, TCTA, 1,3,5-tris(N-phenylbenzimidazole-2-yl)benzene (TPBI), 3-tert-butyl-9,10-di(naphth-2-yl) anthracene (TBADN), distyrylarylene (DSA), 9,9-diethyl-2-(9,9-diethyl-2-(9,9-diethyl-9H-fluoren-2-yl)-9H-fluoren-7-yl)-9H-fluorene(E3), and 4,4'-bis(9-carbazolyl)-2,2'-dimethyl-biphenyl (CDBP), but are not limited thereto.

A suitable dopant may be used as the dopant described above. The suitable dopant may be at least one of a fluorescent dopant and a phosphorescent dopant. Examples of suitable phosphorescent dopant include Ir, Pt, Os, Re, Ti, Zr, Hf, and an organometallic complex including two or more elements above, but are not limited thereto.

Meanwhile, as a suitable red dopant, Pt(II) octaethylporphine (PtOEP), tris(2-phenylisoquinoline)iridium ($Ir(piq)_3$), and bis(2-(2'-benzothienyl)-pyridinato-N,C3')iridium(acetylacetonate) ($Btp_2Ir(acac)$) may be used, but examples of suitable red dopant are not limited thereto.

Alternatively, as a suitable green dopant, tris(2-phenylpyridine) iridium ($Ir(ppy)_3$), bis(2-phenylpyridine)(acetylacetonato)iridium(III) ($Ir(ppy)_2(acac)$), tris(2-(4-tolyl)phenylpyridine)iridium ($Ir(mppy)_3$), and 10-(2-benzothiazolyl)-1,1,7,7-tetramethyl-2,3,6,7-tetrahydro-1H,5H,11H-[1]benzopyrano[6,7,8-ij]-quinolizin-11-one (C545T) may be used, but examples of suitable green dopant are not limited thereto.

Alternatively, as a suitable blue dopant, bis[3,5-difluoro-2-(2-pyridyl)phenyl](picolinato)iridium(III) ($F_2Irpic$), ($F_2ppy)_2Ir(tmd)$, $Ir(dfppz)_3$, 4,4'-bis(2,2'-diphenylethen-1-yl)biphenyl (DPVBi), 4,4'-bis[4-(diphenylamino)styryl]biphenyl (DPAVBi), and 2,5,8,11-tetra-tert-butyl perylene (TBPe) may be used, but examples of suitable blue dopant are not limited thereto.

When the EML 125 includes a host and a dopant, an amount of the dopant may be in a range of about 0.01 to about 15 parts by weight based on 100 parts by weight of the host, but the amount is not limited thereto.

A thickness of the EML 125 may be in a range of about 100 Å to about 1,000 Å, for example, about 200 Å to about 600 Å. In one embodiment, when the thickness of the EML 125 is within the ranges above, the EML 125 has excellent light-emitting ability without a substantial increase in driving voltage.

The ETL 127 may be formed on top of the EML 125. The ETL 127 may include a mixture of an electron-transporting organometallic compound and an electron-transporting organic compound. Examples of suitable electron-transporting organometallic compound in the ETL 127 include LiQ, BAlq, $Alq_3$, and $Bebq_2$, but are not limited thereto. Examples of suitable electron-transporting organic compound in the ETL 127 include BCP, Bphen, TAZ, NTAZ, tBu-PBD, ADN, and compounds of Formulas 201 and 202, but are not limited thereto.

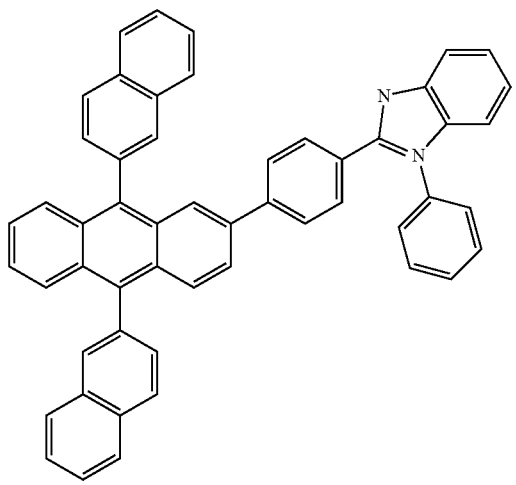

201

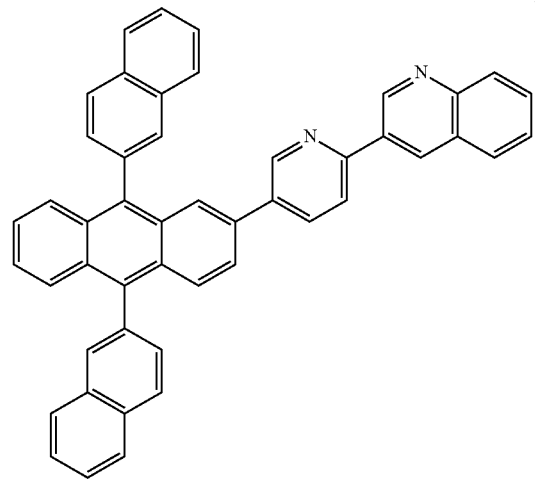

202

In the ETL 127, a weight ratio of the electron-transporting organometallic compound and the electron-transporting organic compound may be in a range of 2:1 to 5:1. In one embodiment, when the weight ratio is within the above ranges, a transport rate of electrons is appropriately reduced for charge balance of electrons in the EML 125.

The ETL 127 may be formed in a way that the electron-transporting organometallic compound and the electron-transporting organic compound are co-deposited, but the method of forming the ETL 127 is not limited thereto.

A thickness of the ETL 127 may be in a range of about 100 Å to about 1,000 Å, for example, about 150 Å to about 500 Å. In one embodiment, when the thickness of the ETL 127 is within the above ranges, the ETL 127 has satisfactory electron transport characteristics without a substantial increase in a driving voltage.

An electron injection layer (EIL), which facilitates injection of electrons from the cathode 131, may be selectively formed on top of the ETL 127. The EIL may use any suitable material for forming the EIL, such as LiF, NaCl, CsF, $Li_2O$, or BaO. The EIL may be formed by, for example, vacuum deposition. A thickness of the EIL may be in a range of about 1 Å to about 100 Å or about 5 Å to about 70 Å. In one embodiment, when the thickness of the EIL is within the above ranges, the EIL has satisfactory electron injection characteristics without a substantial increase in driving voltage.

The cathode 131 may be formed on top the ETL 127 or the EIL. The cathode 131 may be formed of a metal, an alloy, and an electro-conductive compound, which has a low work function, or a mixture thereof. In this regard, the cathode 131 may be formed of lithium (Li), magnesium (Mg), aluminum (Al), aluminum-lithium (Al—Li), calcium (Ca), magnesium-indium (Mg—In), magnesium-silver (Mg—Ag), or the like. In some embodiments, to manufacture a top-emission light-emitting diode, the cathode 131 may be formed as a thin film transmission electrode, and the transmission electrode may be formed using ITO or IZO. The cathode 131 may be formed by, for example, vacuum deposition. A thickness of the cathode 131 may be in a range of about 20 Å to about 300 Å or about 50 Å to about 200 Å.

The OLED 100 may be formed on a substrate. Here, the anode 111 or the cathode 131 included in the OLED 100 may be in contact with the substrate. When the anode 111 is in contact with the substrate, a typical OLED may be provided. When the cathode 131 is in contact with the substrate, an inverted OLED may be provided. The substrate may be a glass substrate or a transparent plastic substrate with strong mechanical strength, thermal stability, transparency, surface smoothness, ease of handling, and water resistance. Alternatively, the substrate may be formed of an opaque material, such as silicon or stainless steel.

FIG. 2 is a schematic cross-sectional view illustrating a structure of an OLED 200 according to another embodiment of the present invention. The OLED 200 is a full color OLED including sub-pixel regions of a red emission region R, a green emission region G, and a blue emission region B.

Referring to FIG. 2, the OLED 200 includes the anode 111, the HIL 121, the HTL 123, an optical auxiliary layer 124, the EML 125, the ETL 127, and the cathode 131. The HTL 123 includes the first HTL 123a, the second HTL 123c, and the buffer layer 123b. The optical auxiliary layer 124 includes a first optical auxiliary layer 124a of the red emission region R and a second optical auxiliary layer 124b of the green emission region G. The EML 125 includes a red EML 125R of the red emission region R, a green EML 125G of the green emission region G, and a blue EML 125B of the blue emission region B.

The OLED 200 of FIG. 2 will be described mainly with regards to its differences from the OLED 100 of FIG. 1. The OLED 200 of FIG. 2 includes the first optical auxiliary layer 124a and the second optical auxiliary layer 124b that are included in the red emission region R and the green emission region G, respectively.

The first HTL 123a may be formed to a thickness in a range of about 300 Å to about 1,000 Å, the buffer layer 123b may be formed to a thickness in a range of about 5 Å to about 20 Å, and the second HTL 123c may be formed to a thickness in a range of about 100 Å to about 200 Å.

The first optical auxiliary layer 124a and the second optical auxiliary layer 124b are to form a resonance structure of the optical microcavity, wherein the layers compensate for an optical resonance distance of light according to a wavelength of the light emitted from the EML 125, and thus may increase emission efficiency. The first optical auxiliary layer 124a and the second optical auxiliary layer 124b may use, for example, a material for forming the first HTL, but examples of materials are not limited thereto. The first optical auxiliary layer 124a may be formed to a thickness in a range of about 500 Å to about 1,300 Å and the second optical auxiliary layer 124b may be formed to a thickness in a range of about 200 Å to about 1,000 Å.

The red EML 125R, the green EML 125G, and the blue EML 125B may respectively be formed of the host and the red dopant, the host and the green dopant, and the host and the blue dopant in which the host of the EML 125 is described with respect to the OLED 100.

In some embodiments, the HTL 124 may be provided in a full color OLED including sub-pixels of different colors other than red, green, and blue.

The OLED of the present specification may not only be a typical OLED having a structure including a substrate/an anode/an HIL/an HTL/an EML/an ETL/an EIL(optional)/a cathode, but also an inverted OLED having a structure including a substrate/a cathode/an EIL(optional)/an ETL/a buffer layer/an EML/an HTL/an HIL/an anode. Furthermore, the OLED of the present specification may be used as not only a bottom-emission light emitting diode, but also a top-emission light-emitting diode.

Example 1

Red Color

An anode was prepared by sonicating a Corning 15 $\Omega/cm^2$ (1,200 Å) ITO glass substrate sequentially in isopropyl alcohol and pure water for 5 minutes each, followed by cleaning by irradiation of ultraviolet rays for 30 minutes. Then, TDATA was vacuum-deposited on top of the ITO glass substrate to form an HIL having a thickness of 650 Å. Next, NPB was vacuum-deposited on the HIL to form a first HTL having a thickness of 590 Å. A layer that the Compound 201 and LiQ were mixed at a weight ratio of 5:1 was vacuum-deposited on the first HTL to form a buffer layer having a thickness of 10 Å. NPB was vacuum-deposited on top of the buffer layer to form a second HTL having a thickness of 1,000 Å. A red EML was formed on top of the second HTL to a thickness of 400 Å using 92 wt % of CBP as a red host and 8 wt % of $Ir(piq)_3$ as a red dopant. A layer that the Compound 201 and LiQ were mixed at a weight ratio of 1:3 was vacuum-deposited on the red EML to form an ETL having a thickness of 300 Å. Then, Al was vacuum-deposited on top of the EML to form a cathode having a thickness of 1,200 Å to thereby complete the formation of the OLED.

Example 2

Green Color

An OLED was manufactured in the same manner as in Example 1, except that the second HTL was formed to a thickness of 700 Å instead of 1,000 Å and a green EML was used instead of the red EML. The green EML was formed to a thickness of 200 Å using 95 wt % of CBP as a green host and 5 wt % of $Ir(ppy)_3$ as a green dopant.

Example 3

Blue Color

An OLED was manufactured in the same manner as in Example 1, except that the second HTL was formed to a thickness of 100 Å instead of 1,000 Å and a blue EML was used instead of the red EML. The blue EML was formed to a thickness of 200 Å using 98 wt % of ADN as a blue host and 2 wt % of DPVBi as a blue dopant.

Example 4

Blue Color

An OLED was manufactured in the same manner as in Example 3, except that the ETL was formed using a layer where the Compound 201 and LiQ were mixed at a weight ratio of 1:2 instead of a weight ratio of 1:3.

Comparative Example 1

Red Color

An OLED was manufactured in the same manner as in Example 1, except that the buffer layer is not used, NPB was vacuum-deposited on top of the HIL to form an HIL having a thickness of 1,600 Å, and the ETL was formed using a layer where the Compound 201 and LiQ were mixed at a weight ratio of 1:1 instead of a weight ratio of 1:3.

Comparative Example 2

Green Color

An OLED was manufactured in the same manner as in Example 2, except that the buffer layer is not used, NPB was vacuum-deposited on the HIL to form an HIL having a thickness of 1,300 Å, and the ETL was formed using a layer where the Compound 201 and LiQ were mixed at a weight ratio of 1:1 instead of a weight ratio of 1:3.

Comparative Example 3

In Regard to Blue Color

An OLED was manufactured in the same manner as in Example 3, except that the buffer layer is not used. NPB was vacuum-deposited on the HIL to form an HTL having a thickness of 700 Å, and the ETL was formed using a layer where the Compound 201 and LiQ were mixed at a weight ratio of 1:1 instead of a weight ratio of 1:3.

FIG. 3 is a graph showing a comparison of relative brightness of each OLED of Example 1 and Comparative Example 1 over time. Referring to FIG. 3, the relative brightness of the OLED of Example 1 over time is maintained higher than that of the OLED of Comparative Example 1.

Figure 4:
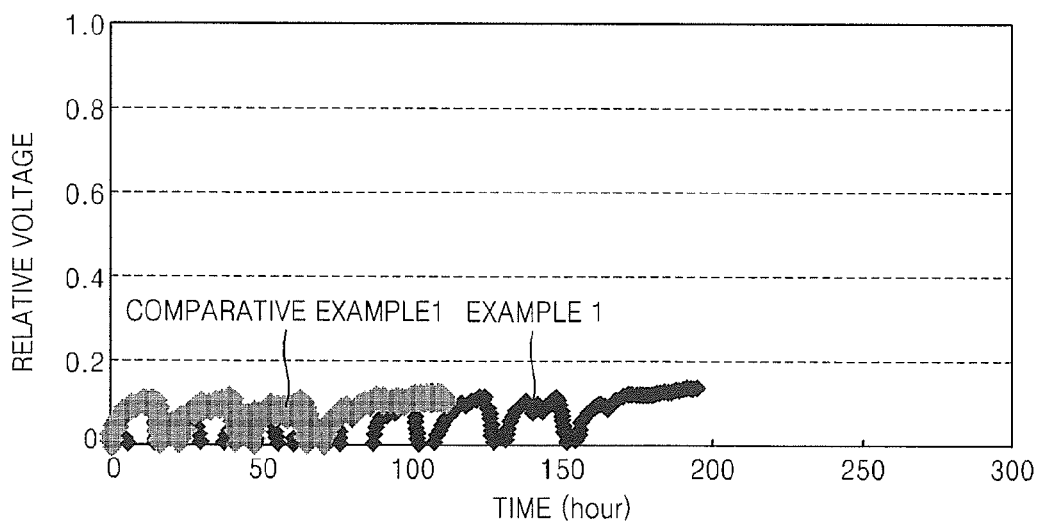
FIG. 4 is a graph showing a comparison of differences in driving voltage of OLEDs of Example 1 and Comparative Example 1 over time.

FIG. 4 is a graph showing a comparison of differences in driving voltage of OLEDs of Example 1 and Comparative Example 1 over time. Referring to FIG. 4, a value of the relative voltage V represents a value of voltage difference from the initial driving voltage. When the difference in the driving voltage is increased according to time, the overall power consumption of a panel may be increased due to the reduction of the lifespan of diodes and the degradation of power efficiency. Referring to FIG. 4, the differences in driving voltage of the OLEDs of Comparative Example 1 and Example 1 are shown to be similar to each other, and thus it is shown that the addition of auxiliary layers between ETLs in Example 1 does not cause a rise of the driving voltage.

Figure 5:
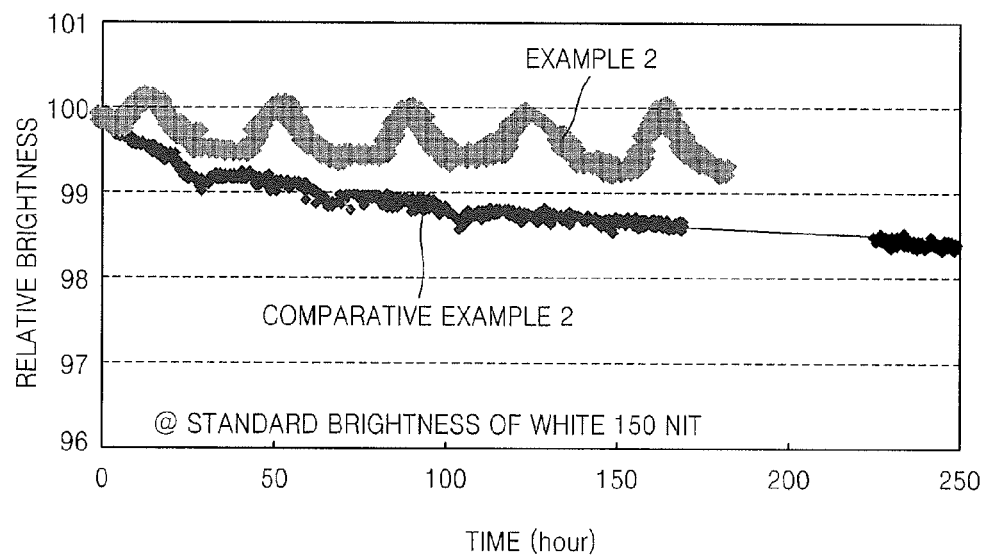
FIG. 5 is a graph showing a comparison of relative brightness of each OLED of Example 2 and Comparative Example 2 over time.

FIG. 5 is a graph showing a comparison of relative brightness of OLEDs of Example 2 and Comparative Example 2 over time. Referring to FIG. 5, the relative brightness of the OLED of Example 2 over time is maintained higher than that of the OLED of Comparative Example 2.

Figure 6:
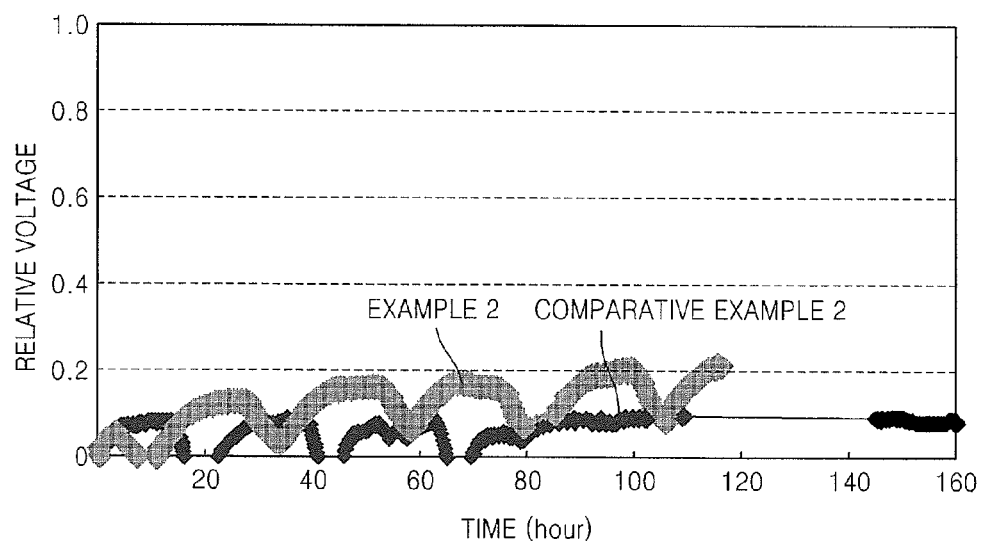
FIG. 6 is a graph showing a comparison of differences in driving voltage of OLEDs of Example 2 and Comparative Example 2 over time.

FIG. 6 is a graph showing a comparison of differences in driving voltage of OLEDs of Example 2 and Comparative Example 2 over time. Referring to FIG. 6, a value of the relative voltage V represents a value of voltage difference from the initial driving voltage. Referring to FIG. 6, the driving voltage of the OLED of Example 2 is maintained slightly higher than that of the OLED of Comparative Example 2, but the difference is not significant.

Figure 7:
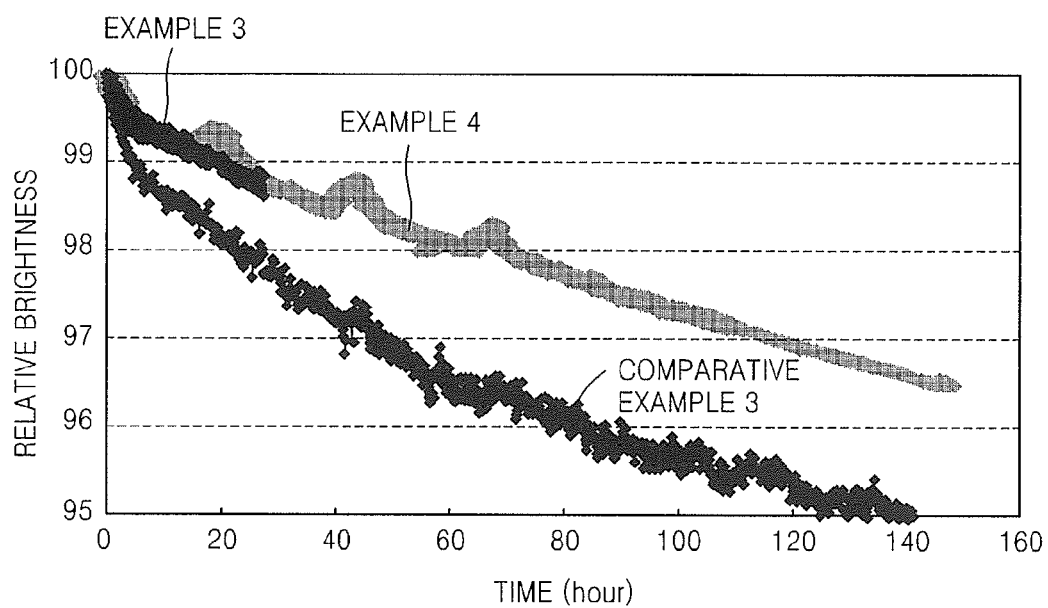
FIG. 7 is a graph showing a comparison of relative brightness of each OLED of Example 3, Example 4, and Comparative Example 3 over time.

FIG. 7 is a graph showing a comparison of relative brightness of OLEDs of Example 3, Example 4, and Comparative Example 3 over time. Referring to FIG. 7, it is shown that the relative brightness of the OLEDs of Examples 3 and 4 over time is maintained higher than that of the OLED of Comparative Example 3.

Figure 8:
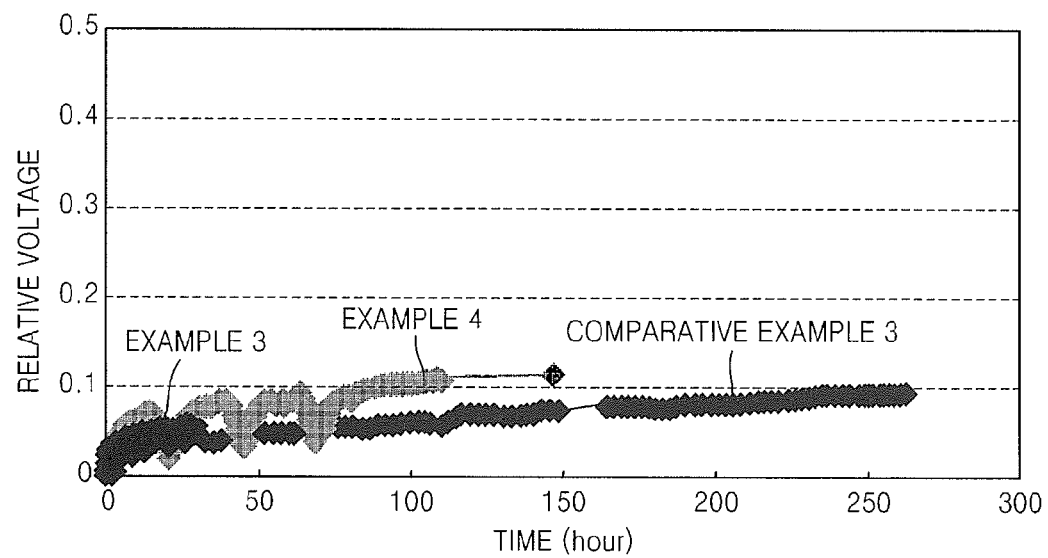
FIG. 8 is a graph showing a comparison of differences in driving voltage of OLEDs of Example 3, Example 4, and Comparative Example 3 over time.

FIG. 8 is a graph showing a comparison of differences in driving voltage of OLEDs of Example 3, Example 4, and Comparative Example 3 over time. Referring to FIG. 8, a value of the relative voltage V represents a value of voltage difference from the initial driving voltage. The driving voltage of the OLEDs of Examples 3 and 4 is maintained slightly higher than that of the OLED of Comparative Example 3, but the difference is not significant.

Referring to FIGS. 3, 5, and 7, M6000 OLED Lifetime Test System, manufactured by McScience Inc., was used to measure brightness over time. Here, the initial brightness was set based on the standard brightness for emission of 150 nit of white light. Based on the graphs shown in FIGS. 3, 5, and 7, it can be observed that the OLED having the structure using the buffer layer between the HTLs has an improved lifetime in all of the red, the green, and the blue OLEDs.

The measurement results of driving voltages, driving current density, brightness, current efficiencies, power efficiencies, and color coordinates of the OLEDs of Examples 1 to 4 and Comparative Examples 1 to 3 are shown in Table 1 below.

TABLE 1

| | Driving voltage (V) | Driving current (mA/cm$^2$) | Brightness (Cd/cm$^2$) | Current efficiency (Cd/A) | Power efficiency (lm/W) | Color coordinate (x-axis) | Color coordinate (y-axis) | Color |
|---|---|---|---|---|---|---|---|---|
| Comparative Example 1 | 5.76 | 10.84 | 1500 | 13.84 | 7.56 | 0.661 | 0.338 | Red |
| Example 1 | 5.22 | 7.83 | 1500 | 19.16 | 11.53 | 0.670 | 0.329 | |
| Comparative Example 2 | 4.90 | 9.93 | 3500 | 35.25 | 22.59 | 0.246 | 0.676 | Green |
| Example 2 | 4.77 | 9.32 | 3500 | 37.55 | 24.74 | 0.245 | 0.666 | |
| Comparative Example 3 | 3.77 | 10.00 | 350 | 3.50 | 2.92 | 0.145 | 0.075 | Blue |
| Example 3 | 3.85 | 6.87 | 350 | 5.10 | 4.16 | 0.145 | 0.076 | |
| Example 4 | 3.45 | 7.35 | 350 | 4.76 | 4.34. | 0.144 | 0.076 | |

Referring to the red emission in Table 1 above, the driving voltage and the driving current of the OLED of Example 1 are lower than those of the OLED of Comparative Example 1 with respect to the same brightness, whereas the current efficiency and the power efficiency of the OLED of Example 1 are higher than those of the OLED of Comparative Example 1. Referring to the green emission in Table 1 above, the driving voltage and the driving current of the OLED of Example 2 are lower than those of the OLED of Comparative Example 2 with respect to the same brightness, whereas the current efficiency and the power efficiency of the OLED of Example 2 are higher than those of the OLED of Comparative Example 2. Referring to the blue emission in Table 1 above, the driving voltage and the driving current of the OLED of Example 4 are lower than those of the OLED of Comparative Example 3 with respect to the same brightness, whereas the current efficiency and the power efficiency of the OLED of Example 3 are higher than those of the OLED of Comparative Example 4.

As shown in FIGS. 3 to 8 and Table 1 above, an OLED of Examples above has improved characteristics, such as driving voltage, current density, brightness, current efficiency, power efficiency, or the like, compared to a comparable OLED.

As described above, according to the one or more embodiments of the present invention, an OLED includes a buffer layer including a mixture of an electron-transporting organometallic compound and an electron-transporting organic compound within a hole transport layer to control a transport rate of holes to thereby improve the lifetime and efficiency of the OLED.

While embodiments of the present invention has been particularly shown and described with reference to example embodiments thereof, it will be understood by those of ordinary skill in the art that various changes in form and details may be made therein without departing from the spirit and scope of embodiments of the present invention as defined by the following claims, and equivalents thereof.

What is claimed is:

1. An organic light-emitting diode, comprising:
    a first electrode and a second electrode facing the first electrode;
    an emission layer between the first electrode and the second electrode;
    a hole transport layer between the first electrode and the emission layer and comprising a first hole transport layer, a second hole transport layer, and a buffer layer between the first hole transport layer and the second hole transport layer, the buffer layer contacting the first hole transport layer and the second hole transport layer; and
    an electron transport layer between the emission layer and the second electrode,
    wherein each of the buffer layer and the electron transport layer comprises a mixture of an electron-transporting organometallic compound and an electron-transporting organic compound.

2. The organic light-emitting diode of claim 1, wherein the electron-transporting organometallic compound comprises lithium quinolate (LiQ), bis(2-methyl-8-quinolinolate)-4-(phenylphenolato)aluminium (BAlq), tris(8-hydroxy-quinolinato)aluminium (Alq$_3$), or beryllium bis(benzoquinolin-10-olate) (Bebq$_2$).

3. The organic light-emitting diode of claim 1, wherein the electron-transporting organic compound comprises 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), 9,10-di(naphthalene-2-yl)anthracene (ADN), or compounds represented by Formulas 201 or 202.

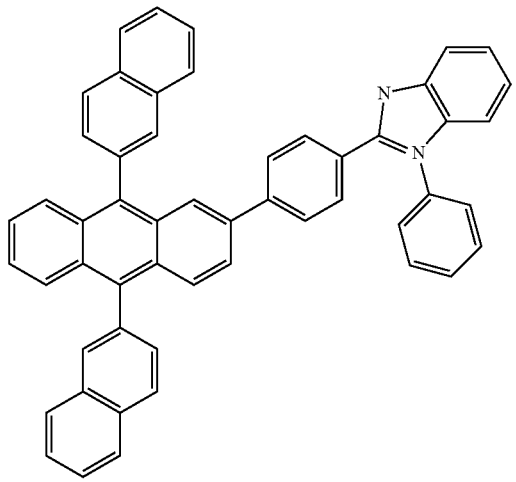

201

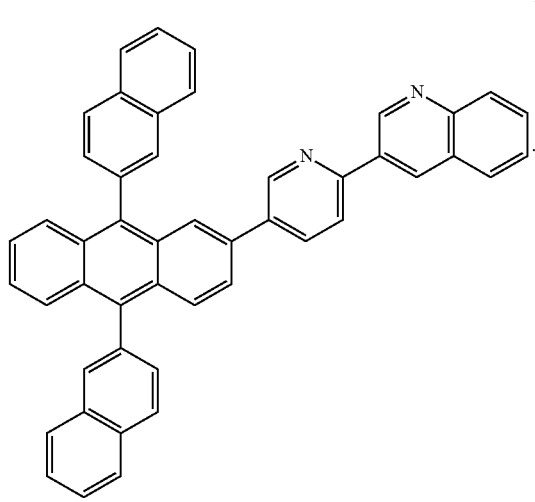

202

4. The organic light-emitting diode of claim 1, wherein a sum of thicknesses of the first hole transport layer and the second hole transport layer is in a range from about 400 Å to about 2,500 Å.

5. The organic light-emitting diode of claim 1, wherein a thickness of the buffer layer is in a range from about 5 Å to about 20 Å.

6. The organic light-emitting diode of claim 1, wherein the electron-transporting organometallic compound and the electron-transporting organic compound are mixed in the buffer layer at a weight ratio in a range from 1:3 to 1:7.

7. The organic light-emitting diode of claim 1, wherein the electron-transporting organometallic compound and the electron-transporting organic compound are mixed in the electron transport layer at a weight ratio in a range from 2:1 to 5:1.

8. The organic light-emitting diode of claim 1, further comprising a hole injection layer between the first electrode and the first hole transport layer.

9. An organic light-emitting diode, comprising:
    a first pixel region;
    a second pixel region;
    a third pixel region;
    a first electrode having regions separated to correspond to the first, second, and third pixel regions;

a first hole transport layer on the regions of the first electrode;

a buffer layer on the first hole transport layer;

a second hole transport layer on the buffer layer;

an emission layer on the second hole transport layer and comprising a first emission layer of the first pixel region, a second emission layer of the second pixel region, and a third emission layer of the third pixel region;

an electron transport layer on the emission layer; and a second electrode on the electron transport layer, wherein each of the buffer layer and the electron transport layer comprises a mixture of an electron-transporting organometallic compound and an electron-transporting organic compound, and wherein the buffer layer contacts the first hole transport layer and the second hole transport layer.

10. The organic light-emitting diode of claim 9, wherein the electron-transporting organometallic compound comprises lithium quinolate (LiQ), bis(2-methyl-8-quinolinolate)-4-(phenylphenolato)aluminium (BAlq), tris(8-hydroxy-quinolinato)aluminium (Alq$_3$), or beryllium bis(benzoquinolin-10-olate) (Bebq$_2$).

11. The organic light-emitting diode of claim 10, wherein the electron-transporting organic compound comprises 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), 9,10-di(naphthalene-2-yl)(anthracene) (ADN), or compounds represented by Formulas 201 or 202.

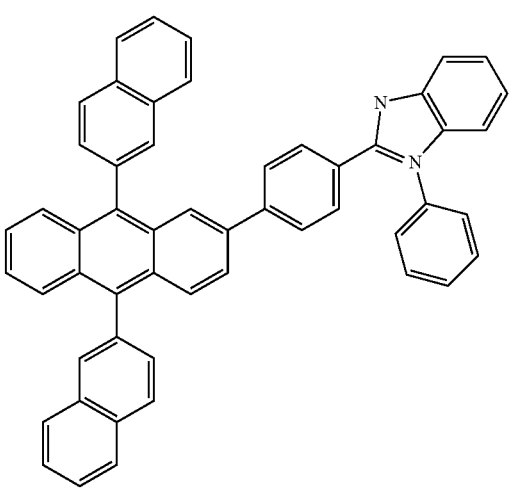

201

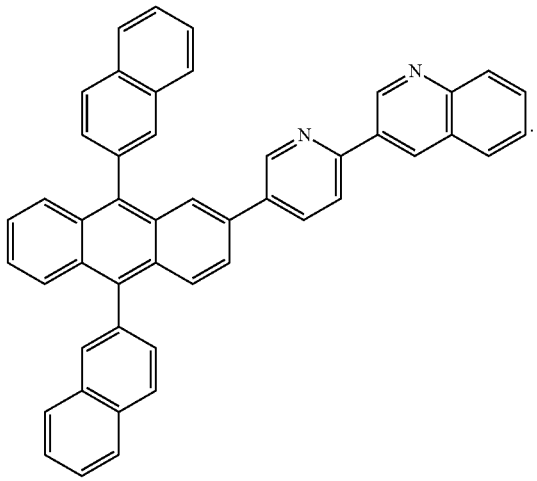

202

12. The organic light-emitting diode of claim 9, wherein a sum of thicknesses of the first hole transport layer and the second hole transport layer is in a range from about 400 Å to about 1,200 Å.

13. The organic light-emitting diode of claim 9, wherein a thickness of the buffer layer is in a range from about 5 Å to about 20 Å.

14. The organic light-emitting diode of claim 9, wherein the electron-transporting organometallic compound and the electron-transporting organic compound are mixed in the buffer layer at a weight ratio in a range from 1:3 to 1:7.

15. The organic light-emitting diode of claim 9, wherein the electron-transporting organometallic compound and the electron-transporting organic compound are mixed in the electron transport layer at a weight ratio in a range from 2:1 to 5:1.

16. The organic light-emitting diode of claim 9, further comprising a first optical auxiliary layer between the second hole transport layer and the first emission layer of the first pixel region; and a second optical auxiliary layer between the second hole transport layer and the second emission layer of the second pixel region.

17. The organic light-emitting diode of claim 9, further comprising a hole injection layer between the first electrode and the first hole transport layer.

18. The organic light-emitting diode of claim 9, wherein the first pixel region displays red color, the second pixel region displays green color, and the third pixel region displays blue color.

19. The organic light-emitting diode of claim 1, wherein the buffer layer consists of the mixture of the electron-transporting organometallic compound and the electron-transporting organic compound.

20. The organic light-emitting diode of claim 9, wherein the buffer layer consists of the mixture of the electron-transporting organometallic compound and the electron-transporting organic compound.

* * * * *